United States Patent
Hoff

(10) Patent No.: US 6,307,414 B1
(45) Date of Patent: Oct. 23, 2001

(54) SLEW RATE/PROPAGATION DELAY SELECTION CIRCUIT

(75) Inventor: Jason K. Hoff, Fort Collins, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/523,505

(22) Filed: Mar. 10, 2000

(51) Int. Cl.[7] .................................................. H03K 5/12

(52) U.S. Cl. ........................ 327/170; 327/170; 327/134

(58) Field of Search ................................. 327/170, 134, 327/270, 269, 393–395, 400, 403–405

(56) References Cited

U.S. PATENT DOCUMENTS

| | | | |
|---|---|---|---|
| 5,355,029 | * | 10/1994 | Houghton et al. .................. 326/26 |
| 5,986,489 | * | 11/1999 | Raza et al. ........................ 327/170 |
| 6,047,346 | * | 4/2000 | Lau et al. ......................... 710/126 |

* cited by examiner

*Primary Examiner*—Toan Tran
*Assistant Examiner*—Cassandra Cox

(57) ABSTRACT

An apparatus comprising a first circuit and a second circuit. The first circuit may be configured to generate a first output signal having a predetermined slew rate and propagation delay in response to a first input signal and a control signal. The second circuit may be configured to generate a second output signal having a predetermined slew rate and propagation delay in response to a second input signal and the control signal.

19 Claims, 4 Drawing Sheets

SLEW RATE/PROPAGATION DELAY SELECTION CIRCUIT

FIELD OF THE INVENTION

The present invention relates to slew rate and propagation delay selection circuits generally and, more particularly, to an apparatus and method for selecting slew rate and propagation delay simultaneously.

BACKGROUND OF THE INVENTION

Slew rate control circuits for IO pads have been used to limit RLC oscillation of signals being driven off-chip and to limit simultaneously switching output (SSO) noise. However, conventional slew rate control circuits have a disadvantage of increasing propagation delay through an IO pad. Most IO pad designers are familiar with a trade off between slew rate control and propagation delay.

Slew rate control circuits are used in IO buffers of computer adapter cards. An adapter card designed for a PCI bus would have a particular propagation delay and slew rate control to meet the standard PCI specification. However, a PCIX bus specification (e.g., an enhanced version of the PCI bus) has a much more forgiving slew rate control requirement and much tighter propagation delay requirement than the standard PCI specification. An adapter card designed for use with the PCIX bus would need to provide less slew rate control, but much faster propagation delay. Since the PCIX bus is an enhanced version of the PCI bus, an adapter card that could operate on both buses would provide an advantage of easy migration from the PCI bus to the PCIX bus.

Conventional control circuits select between different propagation delays or different slew rates. However, the conventional circuits do not simultaneously select between different propagation delays and different slew rates.

A solution to select between different propagation delays and different slew rates simultaneously would be desirable.

SUMMARY OF THE INVENTION

The present invention concerns an apparatus comprising a first circuit and a second circuit. The first circuit may be configured to generate a first output signal having a predetermined slew rate and propagation delay in response to a first input signal and a control signal. The second circuit may be configured to generate a second output signal having a predetermined slew rate and propagation delay in response to a second input signal and said control signal.

The objects, features and advantages of the present invention include providing a method and/or apparatus that may (i) select between different propagation delays, (ii) select between different slew rates, (iii) provide a specific range of output slew rate and/or (iv) provide a specific range of propagation delay.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
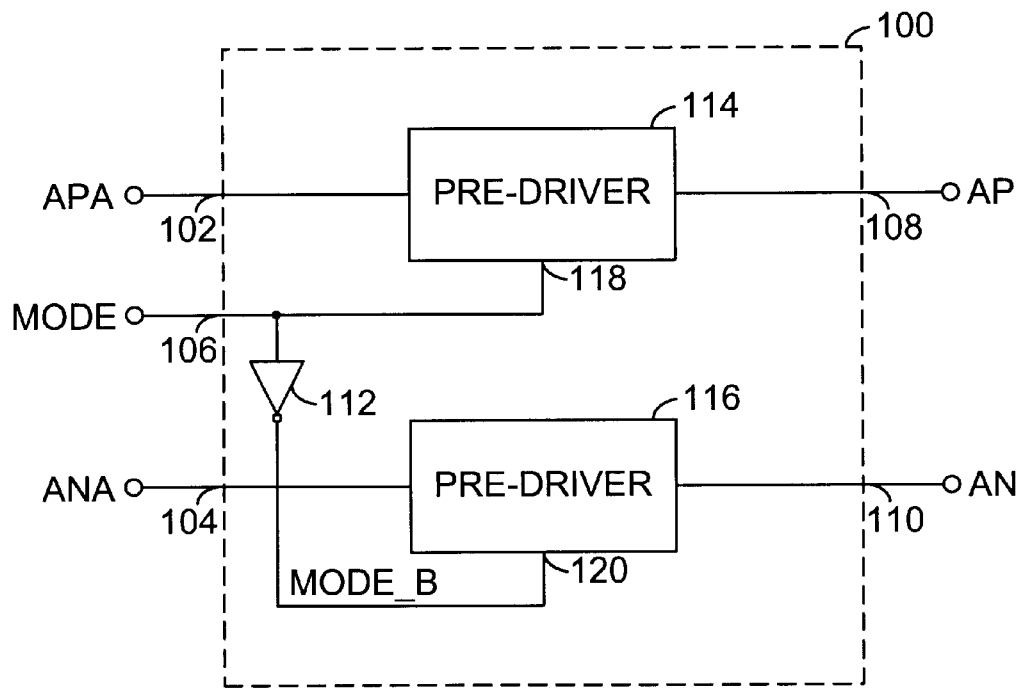
FIG. 1 is a block diagram illustrating a preferred embodiment of the present invention.

Referring to FIG. 1, a block diagram of a circuit 100 illustrating a preferred embodiment of the present invention is shown. The circuit 100 may be, in one example, a dual mode slew rate control circuit. The circuit 100 may have an input 102 that may receive an t signal (e.g., APA), an input 104 that may receive an input signal (e.g., ANA), an input 106 that may receive a control signal (e.g., MODE), an output 108 that may present a signal (e.g., AP) and an output 110 that may present a signal (e.g., AN). The circuit 100 may be configured to generate the signals AN and AP having a predetermined slew rate and propagation delay in response to the signals APA, ANA, and MODE.

The slew rate and propagation delay of the signals AN and AP with respect to the signals APA and ANA may be altered in response to the signal MODE. The circuit 100 may be configured to select between a first and a second predetermined slew rate and propagation delay. The circuit 100 may provide a "slow mode" and a "fast mode" slew rate option. The circuit 100 may provide a specific range of output slew. The circuit 100 may be optimized to provide a specific range of propagation delay in each mode. The circuit 100 may be configured to vary the slew rate within a first predetermined range(e.g., 1v/ns<6v/ns), as well as vary the propagation delay within a second predetermined range (e.g., 0.5 ns <delay<2.7 ns).

The circuit 100 may comprise, in one example, a gate 112, a circuit 114, and a circuit 116. The gate 112 may be implemented, in one example, as an inverter. However, other types of gates may be implemented to meet the design criteria of a particular implementation. The signal MODE may be presented to an input of the gate 112. The gate 112 may be configured to generate a signal (e.g., MODE_B) in response to the signal MODE. The circuit 114 may be configured to generate the signal AP in response to the signal APA and the signal MODE. The circuit 116 may be configured to generate the signal AN in response to the signal ANA and the signal MODE_B.

Figure 2:
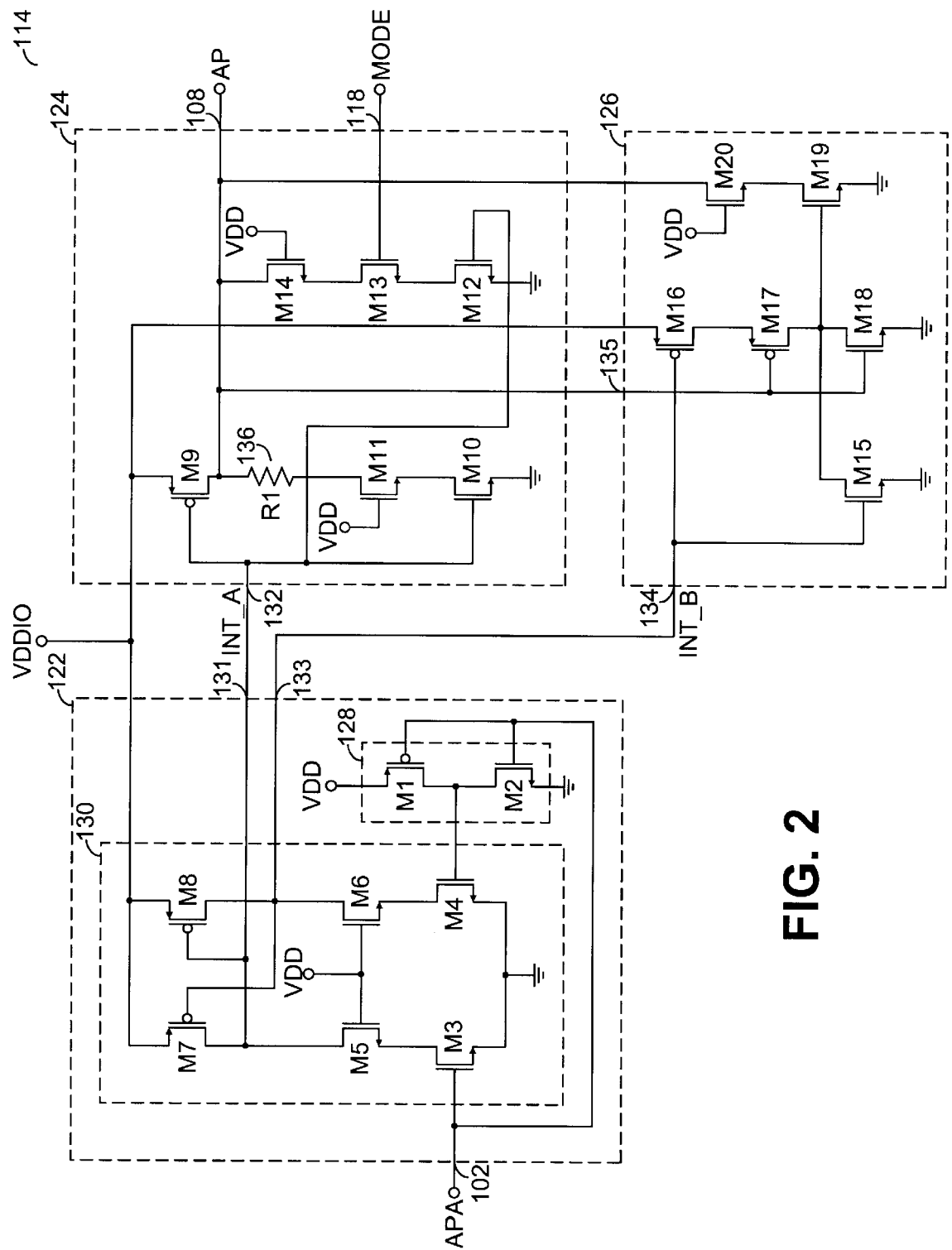
FIG. 2 is a detailed schematic diagram illustrating a first circuit of FIG. 1.

Referring to FIG. 2, a detailed schematic diagram illustrating an implementation of the circuit 114 is shown. The circuit 114 may comprise, in one example, a circuit 122, a circuit 124 and a circuit 126. The signal APA may be presented to an input of the circuit 122. The circuit 122 may have an output 131 that may present a first intermediate signal (e.g., INT_A) to an input 132 of the circuit 124 and an output 133 that may present a second intermediate signal (e.g., INT_B) to an input 134 of the circuit 124. The circuit 122 may be configured to generate the signals INT_A and INT_B in response to the signal APA. The circuit 126 may have an input 135 that may receive the signal AP. The circuit 126 may be configured to generate a load in response to the signals INT_B and AP. The circuit 124 may be configured to generate the signal AP in response to (i) the signal INT_A, (ii) the signal MODE, and (iii) the load generated by the circuit 126.

The circuit 122 may comprise a transistor M1, a transistor M2, a transistor M3, a transistor M4, a transistor M5, a transistor M6, a transistor M7, and a transistor M8. The transistors M1, M7, and M8 may be implemented, in one example, as one or more PMOS transistors. The transistors M2, M3, M4, M5, and M6 may be implemented, in one example, as one or more NMOS transistors. However, other types and polarities of transistors may be implemented to meet the design criteria of a particular implementation. The transistors M1 and M2 may be connected, in one example, as a CMOS inverter 128. The transistors M3, M4, M5, M6, M7, and M8 may be connected, in one example, as a level shifter 130. However, other configurations may be implemented to meet the design criteria of a particular implementation.

The signal APA may be presented to a first input of the level shifter 130 and an input of the CMOS inverter 128. An output of the CMOS inverter 128 may be presented to a second input of the level shifter 130. A first output of the level shifter 130 may present the signal INT_A. A second output of the level shifter 130 may present the signal INT_B.

The circuit 124 may comprise a transistor M9, a transistor M10, a transistor M11, a transistor M12, a transistor M13, a transistor M14, and a device 136. The transistor M9 may be implemented, in one example, as one or more PMOS transistors. The transistors M10, M11, M12, M13, and M14 may be implemented, in one example, as one or more NMOS transistors. However, other types and polarities of transistors may be implemented to meet the design criteria of a particular implementation. The device 136 may be implemented, in one example, as a resistor having a known resistance value (e.g., R1).

The signal INT_A may be presented to a gate of the transistors M9, M10, and M12. A source of the transistor M9 may be connected to a supply voltage (e.g., VDDIO). The supply voltage VDDIO may be implemented as, in one example, 3.3 v. In another example, the supply voltage VDDIO may be implemented at a different or same voltage level as the supply voltage VDD (e.g., 2.5 v). When the voltage supply VDDIO is the same level as the voltage supply VDD, the level shifter 130 may be eliminated. A drain of the transistor M9 may be connected to a first terminal of the resistor 136 and a drain of the transistor M14. A source of the transistor M10 may be connected to a ground potential (e.g., VSS). A drain of the transistor M10 may be connected to a source of the transistor M11. A drain of the transistor M11 may be connected to a second terminal of the resistor 136. The supply voltage VDD may be presented to a gate of the transistor M11.

A source of the transistor M12 may be connected to the ground potential VSS. A drain of the transistor M12 may be connected to a source of the transistor M13. A drain of the transistor M13 may be connected to a source of the transistor M14. The signal MODE may be presented to a gate of the transistor M13. The supply voltage VDD may be presented to a gate of the transistor M14. The signal AP may be presented at a node formed by the drains of the transistors M9 and M14 and the first terminal of the resistor 136.

The circuit 126 may comprise a transistor M15, a transistor M16, a transistor M17, a transistor M18, a transistor M19, and a transistor M20. The transistors M16 and M17 may be implemented, in one example, as one or more PMOS transistors. The transistors M15, M18, M19, and M20 may be implemented, in one example, as one or more NMOS transistors. However, other types and polarities of transistors may be implemented to meet the design criteria of a particular implementation.

The signal INT_B may be presented to a gate of the transistors M15 and M16. A source of the transistor M15 may be connected to the ground potential VSS. A drain of the transistor M15 may be connected to a drain of the transistor M17, a drain of the transistor M18, and a gate of the transistor M19. A source of the transistor M16 may be connected to the supply voltage VDDIO. A drain of the transistor M16 may be connected to a source of the transistor M17. The signal AP may be presented to a gate of the transistors M17 and M18. A source of the transistor M18 and a source of the transistor M19 may be connected to the ground potential VSS. A drain of the transistor M19 may be connected to a source of the transistor M20. A gate of the transistor M20 may be connected to the supply voltage VDD. A drain of the transistor M20 may be connected to the node formed by the drains of the transistors M9 and M14 and the first terminal of the resistor 136.

Figure 3:
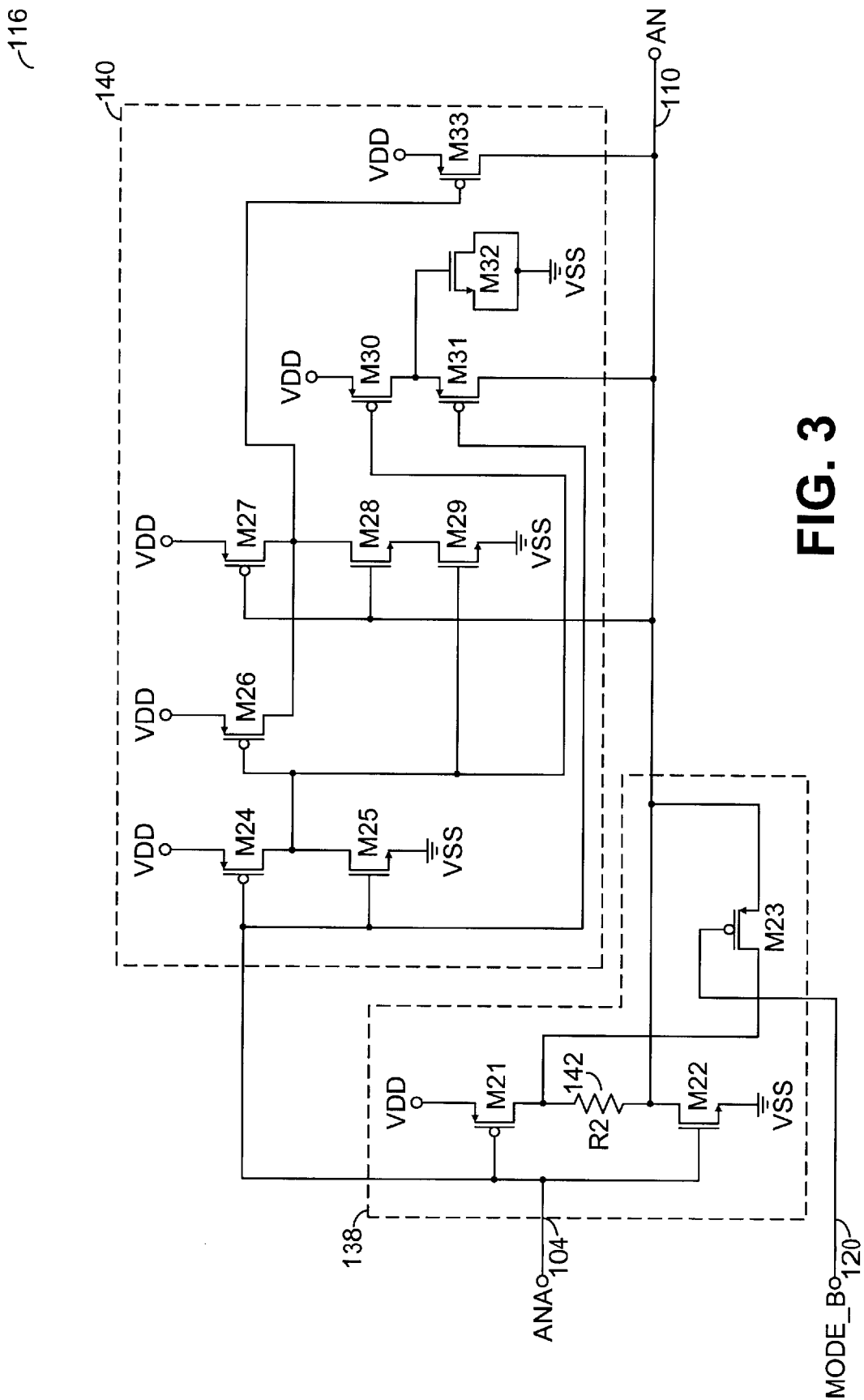
FIG. 3 is a detailed schematic diagram illustrating a second circuit of FIG. 1.

Referring to FIG. 3, a detailed schematic diagram illustrating an implementation of the circuit 116 is shown. The circuit 116 may comprise, in one example, a circuit 138 and a circuit 140. The signal ANA may be presented to a first input of the circuit 138 and a first input of the circuit 140. The signal MODE_B may be presented to a second input of the circuit 138. The signal AN may be presented to a second input of the circuit 140. The circuit 140 may be configured to generate a load in response to the signals ANA and AN. The circuit 138 may be configured to generate the signal AN in response to (i) the signal ANA, (ii) the signal MODE_B, and (iii) the load generated by the circuit 140.

The circuit 138 may comprise, in one example, a transistor M21, a transistor M22, a transistor M23, and a device 142. The transistors M21 and M23 may be implemented, in one example, as one or more PMOS transistors. The transistor M22 may be implemented, in one example, a one or more NMOS transistors. However, other types and polarities of transistors may be implemented to meet the design criteria of a particular implementation. The device 142 may be implemented, in one example, as a resistor having a known resistance value (e.g., R2).

The signal ANA may be presented to a gate of the transistor M21 and a gate of the transistor M22. A source of the transistor M21 may be connected to the supply voltage VDD. A drain of the transistor M21 may be connected to a first terminal of the resistor 142 and a drain of the transistor M23. A source of the transistor M22 may be connected to the ground potential VSS. A drain of the transistor M22 may be connected to a second terminal of the resistor 142 and a source of the transistor M23. The signal MODE_B may be presented to a gate of the transistor M23. The signal AN may be presented at a node formed by the second terminal of the resistor 138, the drain of the transistor M22, and the source of the transistor M23.

The circuit 140 may comprise, in one example, a transistor M24, a transistor M25, a transistor M26, a transistor M27, a transistor M28, a transistor M29, a transistor M30, a transistor M31, a transistor M32, and a transistor M33. The transistors M24, M26, M27, M30, M31, and M33 may be implemented, in one example, as one or more PMOS transistors. The transistors M25, M28, M29, and M32 may be implemented, in one example, a one or more NMOS transistors. However, other types and polarities of transistors may be implemented to meet the design criteria of a particular implementation.

Figure 4:
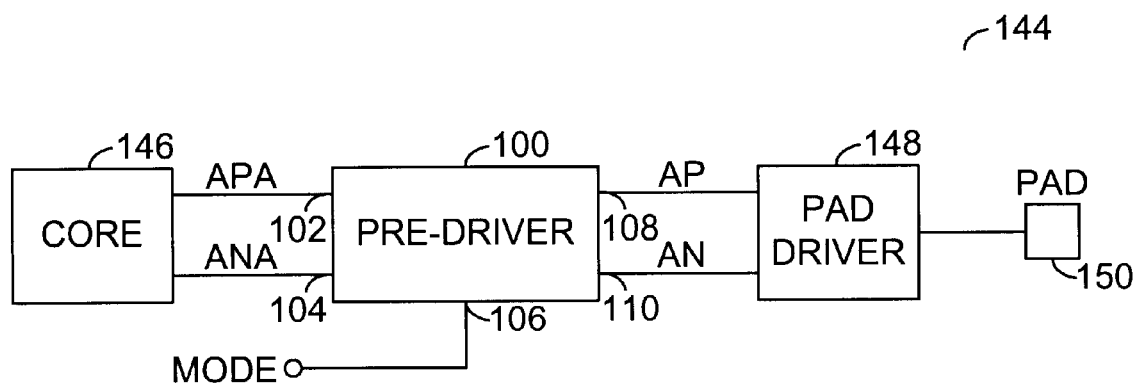
FIG. 4 is a block diagram illustrating an implementation of the circuit of FIG. 1 in accordance with a preferred embodiment of the present invention.

Referring to FIG. 4, a block diagram illustrating an application of the circuit 100 in accordance with the present invention is shown. The circuit 100 may be implemented, in one example, as a pre-driver circuit in the context of an output buffer 144. The signals APA and ANA may be, in one example, presented to the circuit 100 by a core logic block (or circuit) 146. The signals AN and AP may be, in one example, used as input signals to a pad driver circuit 148 that may be configured to drive an I/O pad 150. The I/O pad may be, in one example, an edge connection of a computer adapter card.

When the circuit 100 is used as part of a buffer for a computer adapter card, the signal MODE may be used, in one example, to indicate a type of computer bus connected to the adapter card. For example, in a first state, the signal MODE may indicate that the circuit 100 may be connected to a PCI bus. In a second state, the signal MODE may indicate that the circuit 100 may be connected to a PCIX bus.

The circuit 100 may be used, in one example, as part of an IO buffer on a computer adapter card. When the adapter card is plugged into a high performance bus (e.g., a PCIX backplane), the circuit 100 may switch the buffer into a "fast mode". When the adapter card is plugged into a standard bus (e.g., a PCI backplane), the circuit 100 may switch the buffer into a "slow mode".

When in the fast mode, the circuit 100 may provide less slew rate control. However, the propagation delay may be reduced. Lower slew rate control and faster propagation delay is generally ideal for a high performance bus (e.g., the PCIX bus) that has a more forgiving slew rate control requirement and tighter propagation delay requirement than a standard bus (e.g., PCI). When in the slow mode, the circuit 100 may increase the propagation delay and provide more slew rate control to meet the standard PCI specification.

The circuit 100 may provide, in one example, an improved wave-shaped pre-driver type slew rate controller. The signal MODE may be used to modify the feedback loop that generally shapes the pre-driver signal. When the signal MODE is in a first state (e.g., LOW, or a logical '0'), a first slew rate/delay characteristic of the circuit 100 is generally selected. The first slew rate/delay characteristic may allow the circuit 100 to operate as a normal slew rate controller. When the signal MODE is in a second state (e.g., HIGH, or a logical '1'), a second slew rate/delay characteristic of the circuit 100 is generally selected. The second slew rate/delay characteristic may allow the circuit 100 to change a predetermined configuration to provide only minimal slew rate control with a weak pre-driver signal. When in the fast slew rate mode, the circuit 100 may bypass the slew rate controller, without using multiplexers or other circuitry that could increase propagation delay, to significantly reduce the propagation delay through an IO pad. The waveforms of the signals AN and AP may have much sharper rise times and fall times. Timing diagrams of the signals AN and AP are shown in FIGS. 5(a) and 5(b).

Figure 5A:
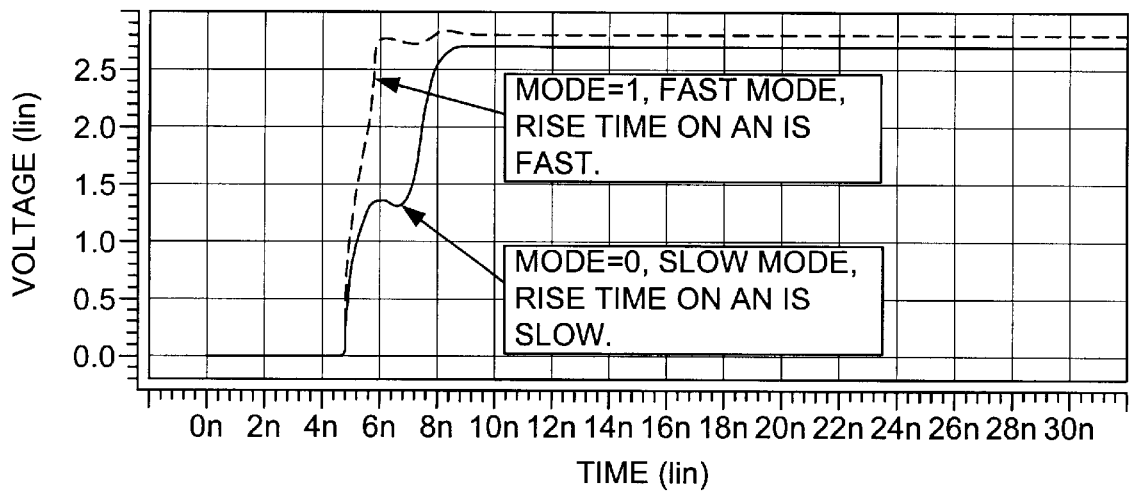
FIGS. 5(a)–5(b) are timing diagrams illustrating an operation of the present invention.
Figure 5B:
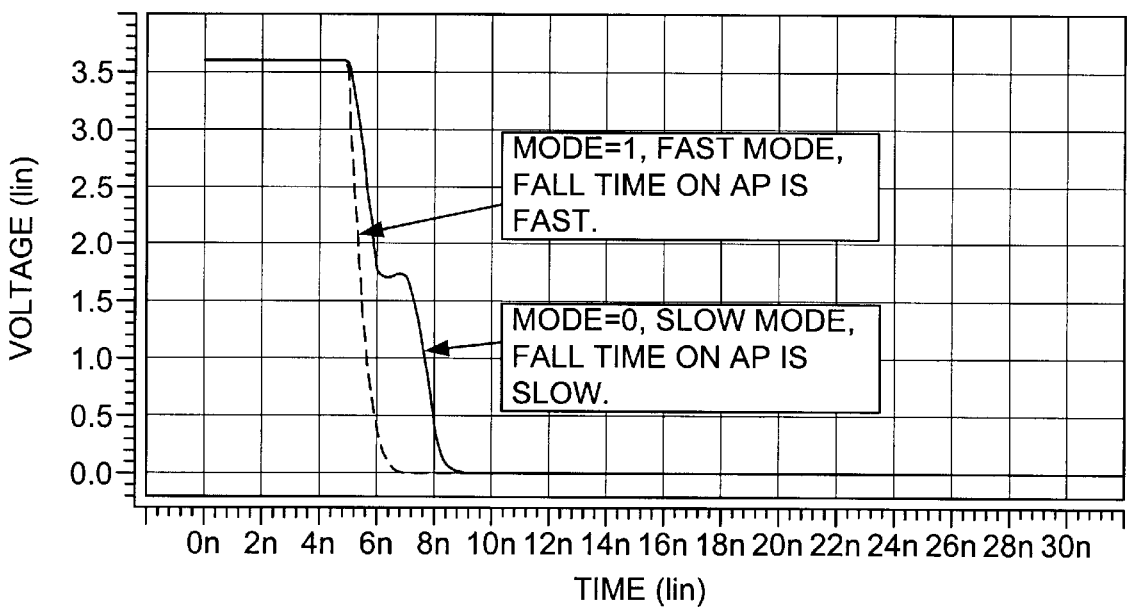

The timing diagrams of FIGS. 5(a) and 5(b) may illustrate the operation of the circuit 100. FIG. 5a may illustrate a rise time of the signal AN during the first and second slew rate/delay characteristics of the circuit 100. FIG. 5b may illustrate a rise time of the signal AP during the first and second slew rate/delay characteristics of the circuit 100. When the signal AN and the signal AP have the first slew rate/propagation delay (slow mode), a step may be introduced to slow down rise and fall times, as well as, increase output propagation delay. When the signal AN and the signal AP have the second slew rate/propagation delay (fast mode), the step is generally removed to sharpen rise and fall times, as well as, decrease output propagation delay.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to generate a first output signal having a predetermined slew rate and propagation delay in response to a first input signal and control signal; and
    a second circuit configured to generate a second output signal having a predetermined slew rate and propagation delay in response to a second input signal and a digital complement of said control signal.

2. The apparatus according to claim 1, wherein said predetermined slew rate and said predetermined propagation delay of said first and second output signals are adjusted simultaneously in response to said control signal.

3. The apparatus according to claim 1, wherein:
    when said control signal is in a first state, a first predetermined slew rate and propagation delay are selected, and
    when said control signal is in a second state, a second predetermined slew rate and propagation delay are selected.

4. The apparatus according to claim 1, wherein said predetermined slew rate is adjustable within a predetermined range.

5. The apparatus according to claim 1, wherein said predetermined propagation delay is adjustable within a predetermined range.

6. The apparatus according to claim 1, wherein said apparatus is implemented as a buffer.

7. The buffer according to claim 6, wherein said buffer is an I/O buffer.

8. The buffer according to claim 6, wherein one or more of said buffers are implemented on an adapter card.

9. The adapter card according to claim 8, wherein said adapter card is connected to one of a PCI bus and a PCIX bus.

10. The apparatus according to claim 1, wherein:
    said first circuit comprises:
        an input circuit configured to generate a first and a second intermediate signal in response to said first input signal;
        an output circuit configured to generate said first output signal in response to (i) said first intermediate signal, (ii) said control signal, and (iii) a first load signal;
        a feedback circuit configured to generate said first load signal in response to said second intermediate signal and said first output signal; and
    said second circuit comprises:
        a circuit configured to generate said second output signal in response to (i) said second input signal, (ii) said digital complement of said control signal, and (iii) a second load signal; and
        a feedback circuit configured to generate said second load signal in response to (i) said second input signal and (ii) said second output signal.

11. The apparatus according to claim 1, wherein said first circuit comprises:
    a first transistor connected to a first terminal of a resistor having a known resistance value;
    a second transistor connected to a second terminal of said resistor;
    a third transistor connected to a fourth transistor;
    said fourth transistor connected to said first terminal of said resistor, wherein (i) an intermediate signal is presented to a gate of said first, said second and said third transistors, (ii) said control signal is presented to a gate of said fourth transistor, and (iii) said first output signal is presented at said first terminal of said resistor.

12. The apparatus according to claim 1, wherein said second circuit comprises:
   a first transistor connected to a second transistor and a first terminal of a resistor having a known resistance value; and
   a third transistor connected to said second transistor and a second terminal of said resistor, wherein (i) said second input signal is presented to a gate of said first and said third transistors, (ii) said digital complement of said control signal is presented to a gate of said second transistor, and (iii) said second output signal is presented at said second terminal of said resistor.

13. An apparatus comprising:
   means for generating a first output signal having a predetermined slew rate and a predetermined propagation delay in response to (i) a first input signal and (ii) a control signal; and
   means for generating a second output signal having a predetermined slew rate and a predetermined propagation delay in response to (i) a second input signal and (ii) a digital complement of said control signal.

14. A method of controlling the slew rate and propagation delay of an I/O signal comprising the steps of:
   (A) generating a first output signal having a predetermined slew rate and a predetermined propagation delay in response to (i) a first input signal and (ii) a control signal; and
   (B) generating a second output signal having a predetermined slew rate and a predetermined propagation delay in response to (i) a second input signal and (ii) a digital complement of said control signal.

15. The method according to claim 14, further comprising the steps of:
   when said control signal is in a first state, selecting a first predetermined slew rate and propagation delay; and
   when said control signal is in a second state, selecting a second predetermined slew rate and propagation delay.

16. An apparatus comprising:
   a first circuit configured to generate a first output signal having a predetermined slew rate and propagation delay in response to a first input signal and control signal; and
   a second circuit configured to generate a second output signal having a predetermined slew rate and propagation delay in response to a second input signal and said control signal, wherein:
   said first circuit comprises:
      an input circuit configured to generate a first and a second intermediate signal in response to said first input signal;
      an output circuit configured to generate said first output signal in response to (i) said first intermediate signal, (ii) said control signal, and (iii) a first load signal; and
      is a feedback circuit configured to generate said first load signal in response to said second intermediate signal and said first output signal; and
   said second circuit comprises:
      a circuit configured to generate said second output signal in response to (i) said second input signal, (ii) said control signal, and (iii) a second load signal; and
      a feedback circuit configured to generate said second load signal in response to (i) said second input signal and (ii) said second output signal.

17. The apparatus according to claim 16, wherein said second circuit is configured to generate said second output signal in response to a digital complement of said control signal.

18. An apparatus comprising:
   a first circuit configured to generate a first output signal having a predetermined slew rate and propagation delay in response to a first input signal and a control signal; and
   a second circuit configured to generate a second output signal having a predetermined slew rate and propagation delay in response to a second input signal and said control signal, wherein said first circuit comprises:
      a first transistor connected to a first terminal of a resistor having a known resistance value;
      a second transistor connected to a second terminal of said resistor;
      a third transistor connected to a fourth transistor; and
      said fourth transistor connected to said first terminal of said resistor, wherein (i) an intermediate signal is presented to a gate of said first, said second and said third transistors, (ii) said control signal is presented to a gate of said fourth transistor, and (iii) said first output signal is presented at said first terminal of said resistor.

19. An apparatus comprising:
   a first circuit configured to generate a first output signal having a predetermined slew rate and propagation delay in response to a first input signal and control signal; and
   a second circuit configured to generate a second output signal having a predetermined slew rate and propagation delay in response to a second input signal and said control signal, wherein said second circuit comprises:
      a first transistor connected to a second transistor and a first terminal of a resistor having a known resistance value; and
      a third transistor connected to said second transistor and a second terminal of said resistor, wherein (i) said second input signal is presented to a gate of said first and said third transistors, (ii) said control signal is presented to a gate of said second transistor, and (iii) said second output signal is presented at said second terminal of said resistor.

* * * * *